(12) United States Patent
Chung et al.

(10) Patent No.: US 8,378,376 B2
(45) Date of Patent: Feb. 19, 2013

(54) VERTICAL LIGHT-EMITTING DIODE

(75) Inventors: Wei-Jung Chung, Pingtung (TW); Shih-Hung Lee, Caotun Township, Nantou County (TW); Cheng-Hsien Li, Kaohsiung (TW); Wen-Hsien Lin, Anding Township, Tainan County (TW); Nien-Tze Yeh, Zhongli (TW)

(73) Assignee: Tekcore Co., Ltd., Nantou (TW)

( * ) Notice: Subject to any disclaimer, the term of this patent is extended or adjusted under 35 U.S.C. 154(b) by 100 days.

(21) Appl. No.: 12/846,937

(22) Filed: Jul. 30, 2010

(65) Prior Publication Data

US 2011/0163293 A1  Jul. 7, 2011

(30) Foreign Application Priority Data

Jul. 31, 2009 (TW) .............................. 98125987 A

(51) Int. Cl.
*H01L 33/00* (2010.01)
(52) U.S. Cl. .............. 257/99; 257/E33.07; 257/E33.055
(58) Field of Classification Search .................... 257/13, 257/79, E33.008, 99, E33.07, E33.055
See application file for complete search history.

(56) References Cited

U.S. PATENT DOCUMENTS 6,744,071 B2 *  6/2004  Sano et al. ...................... 257/79

* cited by examiner

*Primary Examiner* — Thomas L Dickey
*Assistant Examiner* — Nikolay Yushin
(74) *Attorney, Agent, or Firm* — Baker & McKenzie LLP

(57) ABSTRACT

The present application describes a vertical light-emitting diode (VLED) and its manufacture method that use the combination of a reflective layer, a transparent conducting layer and transparent dielectric layer as structural layers for promoting uniform current distribution and increasing light extraction. In the VLED, a transparent conducting layer is formed on a first outer surface of a stack of multiple group III nitride semiconductor layers. A transparent dielectric layer is then formed on a side of the transparent conducting layer opposite the side of the multi-layer structure. A first electrode structure is then formed on the transparent dielectric layer in electrical contact with the transparent conducting layer via a plurality of contact windows patterned through the transparent dielectric layer. The transparent conducting layer and the transparent dielectric layer are used as structural layers for improving light extraction.

20 Claims, 5 Drawing Sheets

VERTICAL LIGHT-EMITTING DIODE

CROSS-REFERENCE TO RELATED APPLICATION

This application claims priority of Taiwan patent application no. 98125987, filed on Jul. 31, 2009.

BACKGROUND OF THE INVENTION

1. Field of the Invention

The present invention relates to light-emitting diodes and manufacture methods thereof, and more particularly to group III nitride semiconductor vertical type light-emitting diodes (VLED) and its manufacture methods.

2. Description of the Related Art

Light-emitting diode (LED) is a semiconductor component part that can emit visible light produced as a result of the recombination of electrons and holes in the semiconductor structure. A different wavelength of light can be emitted by adjusting the band gap of the semiconductor layer structure.

FIG. 1 is a schematic view illustrating a conventional vertical-type light-emitting diode 100. The VLED 100 mainly comprises a n-type semiconductor layer 106, a light-emitting layer 108, and a p-type semiconductor layer 110, mainly made of group III-nitride semiconductor compounds. Such layer structure is grown on a substrate (not shown), which is then removed from the final VLED 100.

During operation, light emitted from the light-emitting layer 108 spreads in all directions. For improving light extraction, a reflective layer 111 is usually formed below the p-type semiconductor layer 110 for redirecting light emitted by the light-emitting layer 108. In addition, the conventional VLED 100 may also incorporate a metal layer 112 for increasing current distribution during operation and enhance heat dissipation.

Further, a p-type electrode 114 is formed under the metal layer 112, and a n-type electrode 116 is formed above the n-type semiconductor layer 116. Operation of VLED 100 is performed by generating a current flow between the two electrodes.

Even with the reflective layer 111, some of the light from the light-emitting layer 108 still cannot exit the VLED 100 owing to inner absorption, refraction or interference. To improve light extraction, Taiwan Patent Application Publication No. 200847462 entitled "Vertical light emitting diode device structure", the disclosure of which is incorporated herein by reference, proposes a layer structure in which a "spacer" is interposed between the light-emitting layer 108 and the p-type semiconductor layer 110. The material of the spacer is a compound having chemical formula $Al_xGa_yIn_zN$, wherein $0 \leq x, y, z \leq 1$. Such approach requires to modify the epitaxy deposition of the group III-nitride semiconductor compounds, which may adversely affect the active layers of the VLED 100.

Therefore, there is a need for a VLED structure and manufacture method that can increase extraction efficiency and address the foregoing issues.

SUMMARY

The present application describes a vertical light-emitting diode and a manufacture method. In some embodiments, the vertical light-emitting diode comprises a multi-layer structure including a plurality of group III-nitride semiconductor compound layers, a transparent conducting layer located on a first outer surface of the multi-layer structure, a transparent dielectric layer in contact with the transparent conducting layer on a side opposite to the side of the multi-layer structure, wherein the transparent dielectric layer includes a plurality of contact windows, a first electrode structure located on the transparent dielectric layer and in contact with the transparent conducting layer via the contact windows, and a second electrode structure located on the second outer surface.

In other embodiments, a method of manufacturing the vertical light-emitting diode is described. The method comprises forming a multi-layer structure of group III nitride semiconductor compound layers on a substrate, forming a transparent conducting layer on the multi-layer structure, forming a transparent dielectric layer on a side of the transparent conducting layer opposite to the side of the multi-layer structure, forming a plurality of contact windows through the transparent dielectric layer, forming a first electrode structure on the transparent dielectric layer, wherein the first electrode structure is in electrical contact with the transparent conducting layer via the contact windows, removing the substrate to expose a surface of the multi-layer structure, and forming a second electrode structure on the exposed surface of the multi-layer structure.

DETAILED DESCRIPTION OF THE EMBODIMENTS

The present application describes a vertical light-emitting diode (VLED) and its manufacture method that use the combination of a reflective layer, a transparent conducting layer and transparent dielectric layer as structural layers for promoting uniform current distribution and increasing light extraction. The VLED comprises a multi-layer structure comprising a plurality of group III nitride semiconductor compound layers, wherein the multi-layer structure has a first outer surface and a second outer surface opposite the first outer surface. A transparent conducting layer is then formed on the first outer surface, followed with a transparent dielectric layer formed on a side of the transparent conducting layer opposite the side of the multi-layer structure. A first electrode structure is then formed on the transparent dielectric layer in electrical contact with the transparent conducting layer via a plurality of contact windows patterned through the transparent dielectric layer. The transparent conducting layer and the transparent dielectric layer are used as structural layers for improving light extraction. As these layers are formed after completion of the epitaxy growth, the deposition of the group III-nitride semiconductor compounds is not affected.

For clarity, the term "group III-nitride compounds" as used herein refers to any compounds that contain nitrogen(N) and chemical elements classified in the group III of the periodic table of chemical elements (such as aluminum(Al), gallium (Ga), indium(In)), and ternary compounds or quaternary compounds thereof (such as AlGaN, AlInGaN). Moreover, it is worth noting that the multi-layer structure of group III nitride semiconductor compounds can include any suitable layer structures for VLED. In one embodiment, this stack of layers can include, without limitation, a light-emitting layer sandwiched between a n-type semiconductor layer and a p-type semiconductor layer.

EXAMPLES

Figure 1:
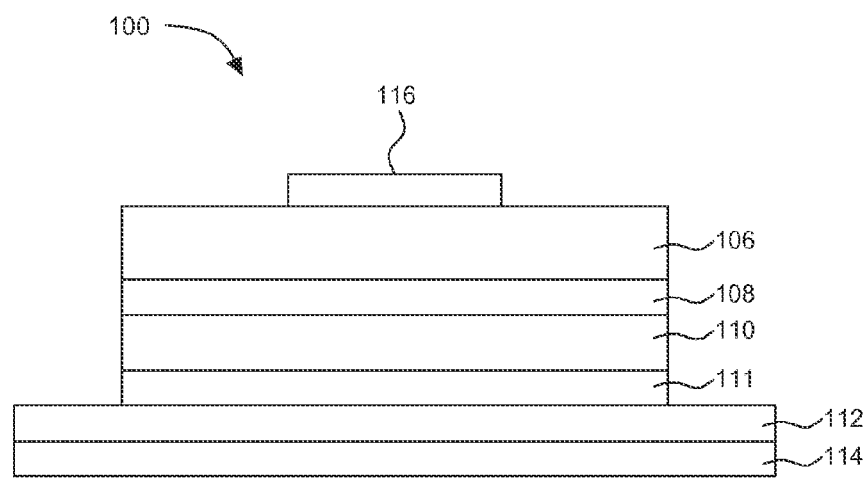
FIG. 1 is a schematic view illustrating a conventional vertical light-emitting diode.
Figure 2A:
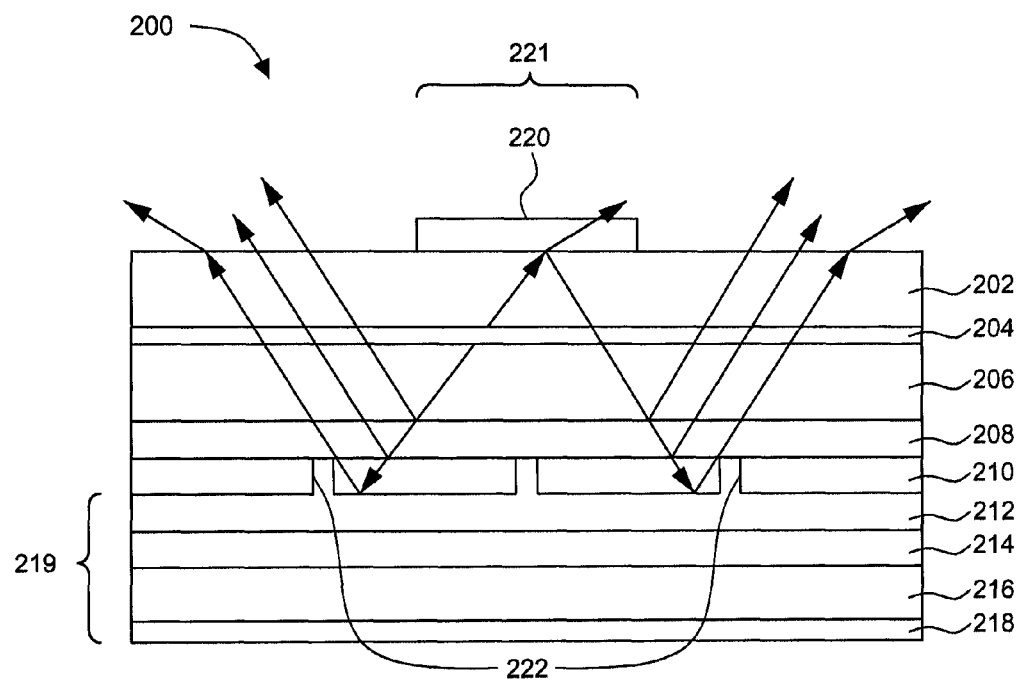
FIG. 2A is a schematic view illustrating one embodiment of a vertical light-emitting diode.

FIG. 2A is a schematic view illustrating one embodiment of a VLED 200. The VLED 200 includes a light-emitting layer 204 sandwiched between a n-type semiconductor layer 202 and a p-type semiconductor layer 206. The n-type semiconductor layer 202, light-emitting layer 204 and p-type semiconductor layer 206 can be made of a material comprising GaN or similar group III-nitride compounds. In addition, the light-emitting layer 204 can be formed from a multiple quantum-well structure.

As shown in FIG. 2A, a transparent conducting layer 208, a transparent dielectric layer 210, a reflective layer 212, a metal layer 214, a conducting substrate 216, and a p-type electrode 218 are formed in sequence on the side of the p-type semiconductor layer 206 opposite the light-emitting layer 204. The transparent conducting layer 208 is made of a transparent conducting material, such as indium tin oxide (ITO), aluminum zinc oxide (AZO) and the like. During operation, electric current flows vertically through the VLED 200 and distributes uniformly across the transparent conducting layer 208 owing to its good conduction. The reflective layer 212, the metal layer 214, the conducting substrate 216, and the p-type electrode 218 form a first electrode structure 219 of the VLED 200.

The transparent dielectric layer 210 can include, without limitation, $SiO_2$, $Si_3N_4$, $TiO_2$, and like transparent dielectric material(s). In some variant embodiments, the transparent dielectric layer 210 can be a single layer or combination of multiple layers. The reflective layer 212 redirects the light emitted from the light-emitting layer 204, and electrically connects with the transparent conducting layer 208 via a plurality windows 222 formed through the transparent dielectric layer 210. According to one embodiment, the reflective layer 212 can be made of a material comprising a metal or a metallic alloy, such as Ag, Au, Pt, Pd, Al, Cu or any combination thereof. The metal layer 214 is used to increase conductivity of the first electrode structure 219 and promote its bonding or electro-plating on the conducting substrate 216.

The light produced from the light-emitting layer 204 spreads in all directions. In particular, an amount of the emitted light can pass through the transparent dielectric layer 210 to reach the reflective layer 212 with very small and negligible loss. The length of the light propagation path can be set by adjusting the thickness of the transparent dielectric layer 210, such that light transmitting from the transparent dielectric layer 210 to the reflective layer 212 can be in constructive interference with other light paths resulting from refraction or reflection in the VLED 200, or with the light produced from the light-emitting layer 204. In this manner, light extraction efficiency can be increased. In one embodiment, the thickness of the transparent dielectric layer 210 is preferably smaller than about 2 microns, and the thickness of the transparent conducting layer 208 is smaller than about 4000 Angstroms.

Referring again to FIG. 2A, the conducting substrate 216 is made of a metallic or semiconductor material for better heat dissipation and mechanical strength. A n-type electrode 220 is formed on the side of the n-type semiconductor layer 202 opposite to the side of the light-emitting layer 204 for forming a second electrode structure 221. During operation, electric current can flow between the p-type electrode 218 and the n-type electrode 220.

With the aforementioned layer structure, electric current can flow vertically between the n-type electrode 220 and the p-type electrode 218, which results in a current distribution that is more uniform in the VLED 200 than in a conventional horizontal LED. Moreover, the transparent conducting layer 208 can promote current distribution, and light emission efficiency of the VLED 200 can be accordingly improved. The respective thickness of the transparent dielectric layer 210 and reflective layer 212 can also be used to adjust the length of light propagation path for obtaining improved light extraction efficiency.

Figure 2B:
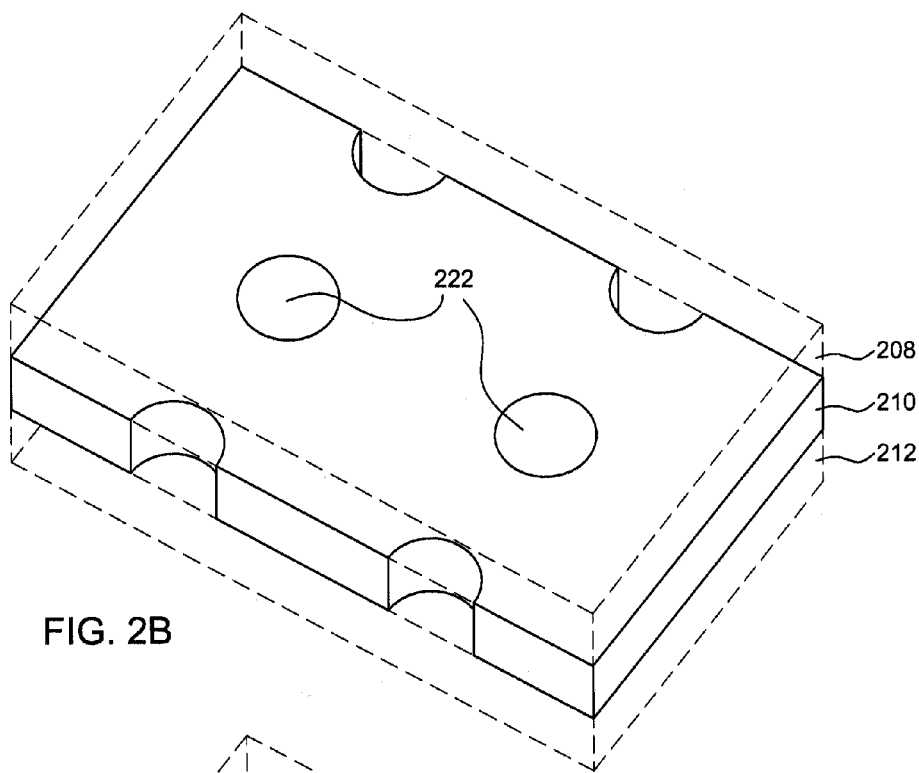
FIGS. 2B and 2C are schematic views illustrating various configurations of contact windows formed through a transparent dielectric layer in the vertical light-emitting diode shown in FIG. 2A.
Figure 2C:
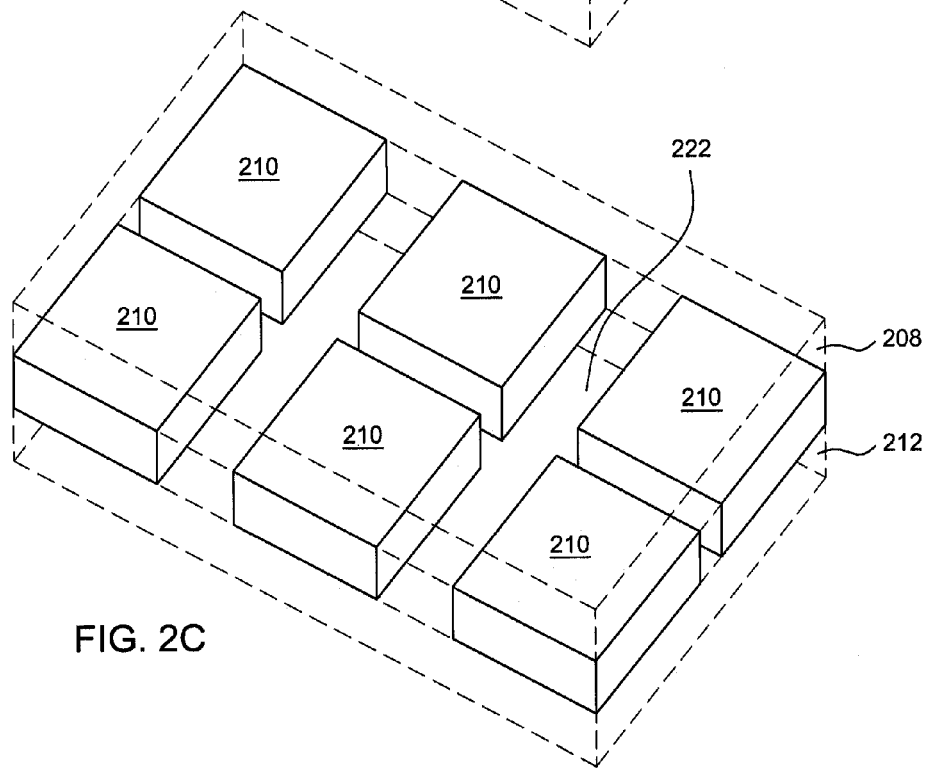

FIGS. 2B and 2C are schematic views illustrating various configurations of the transparent dielectric layer 210. The transparent dielectric layer 210 is located between the transparent conducting layer 208 and the reflective layer 212. Electric current flows in a vertical direction in the VLED 200. The transparent dielectric layer 210 allows transmission of visible light, but blocks vertical flow of the electric current. To enable electric current flowing, the transparent dielectric layer 210a includes a plurality of contact windows 222 through which the transparent conducting layer 208 can be in electrical connection with the underlying reflective layer 212. As shown in FIG. 2B, each of the conductive windows 222 can have a cylindrical shape. In alternate embodiments, as shown in FIG. 2C, the contact windows 222 can also be formed in a cross-shape to divide the transparent dielectric layer 210 into multiple island regions. The transparent conducting layer 208 can thereby be in conductive connection with the underlying reflective layer 212 through the cross-shaped contact windows 222. The transparent dielectric layer 210 can be a single layer or combination of multiple layers. It will be understood that the contact windows 222 are not limited in shape, and other configurations may also be possible.

Figure 3A:
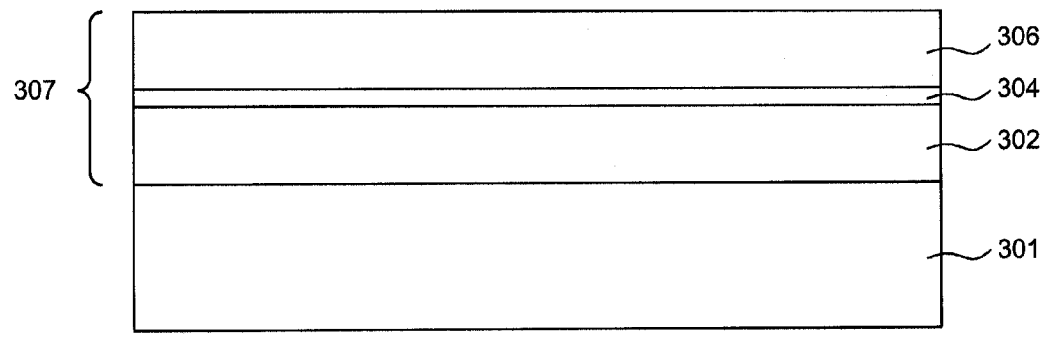
FIGS. 3A through 3E are schematic views illustrating method steps for fabricating a vertical light-emitting diode.

FIGS. 3A-3E are schematic views illustrating method steps for manufacturing a VLED. Referring to FIG. 3A, a substrate 301 (e.g., sapphire substrate) is first placed in an epitaxy deposition system. A multi-layer structure 307 of group III-nitride semiconductor compounds including, without limitation, a n-type semiconductor layer 302, a light-emitting layer 304 and a p-type semiconductor layer 306, are sequentially deposited by epitaxy growth on the substrate 301. According to one embodiment, metal-organic chemical vapor deposition can be used to form the multi-layer structure 307. Once the n-type semiconductor layer 302, the light-emitting layer 304 and the p-type semiconductor layer 306 are formed, the substrate 301 can be removed from the epitaxy deposition system.

Figure 3B:
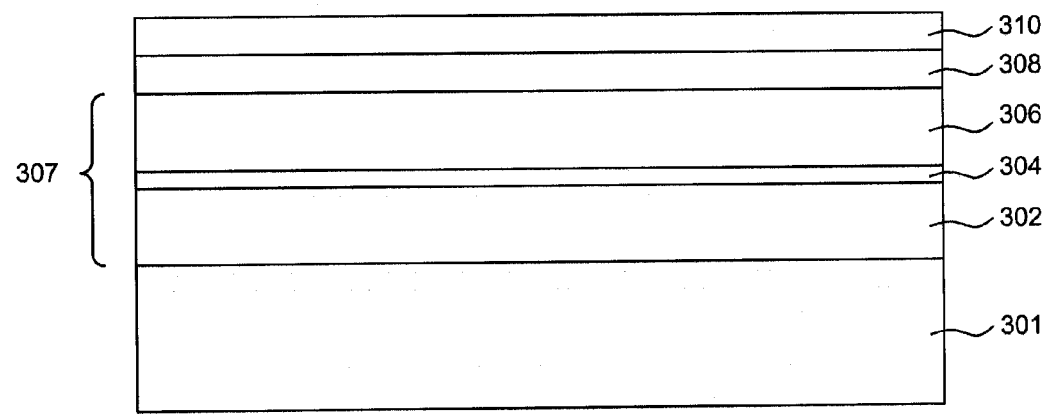

Next referring to FIG. 3B, the substrate 301 provided with the multi-layer structure 307 can be then placed in another deposition system for forming a transparent conducting layer 308 and a transparent dielectric layer 310 on the p-type semiconductor layer 306. More specifically, the transparent conducting layer 308 and transparent dielectric layer 310 can be formed by deposition methods such as evaporating deposition, sputtering deposition and the like. After deposition of the transparent dielectric layer 310, a photo-lithography and etching process can be conducted to pattern the transparent dielectric layer 310 and form contact windows 322 therein.

Figure 3C:
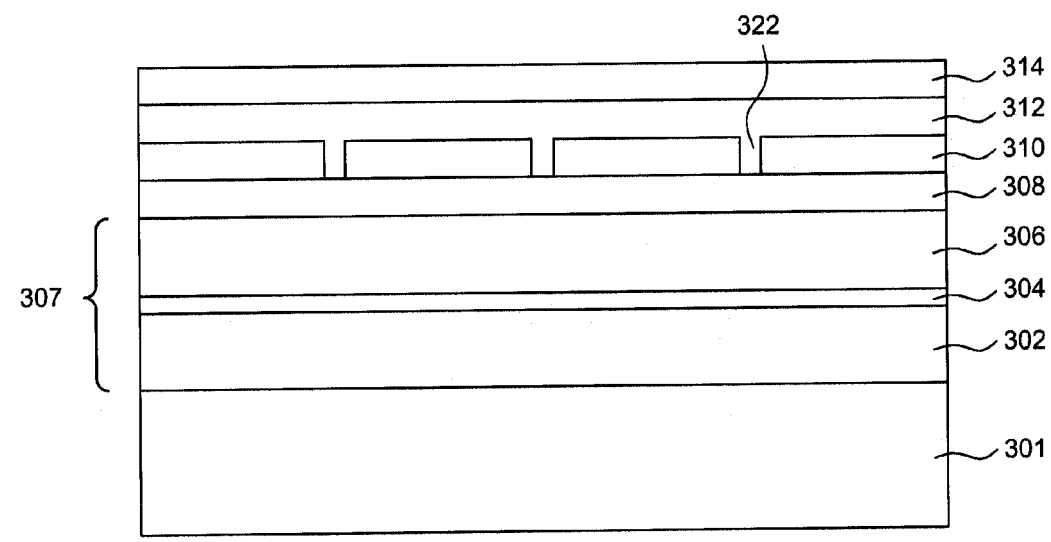

Referring to FIG. 3C, a reflective layer 312 and a metal layer 314 are then formed respectively formed on the transparent dielectric layer 310 by electron-beam evaporation or other suitable methods of metal deposition. The reflective layer 312 and metal layer 314 can be thereby electrically connected with the transparent conducting layer 308 via the contact windows 322 patterned through the transparent dielectric layer 310.

Figure 3D:
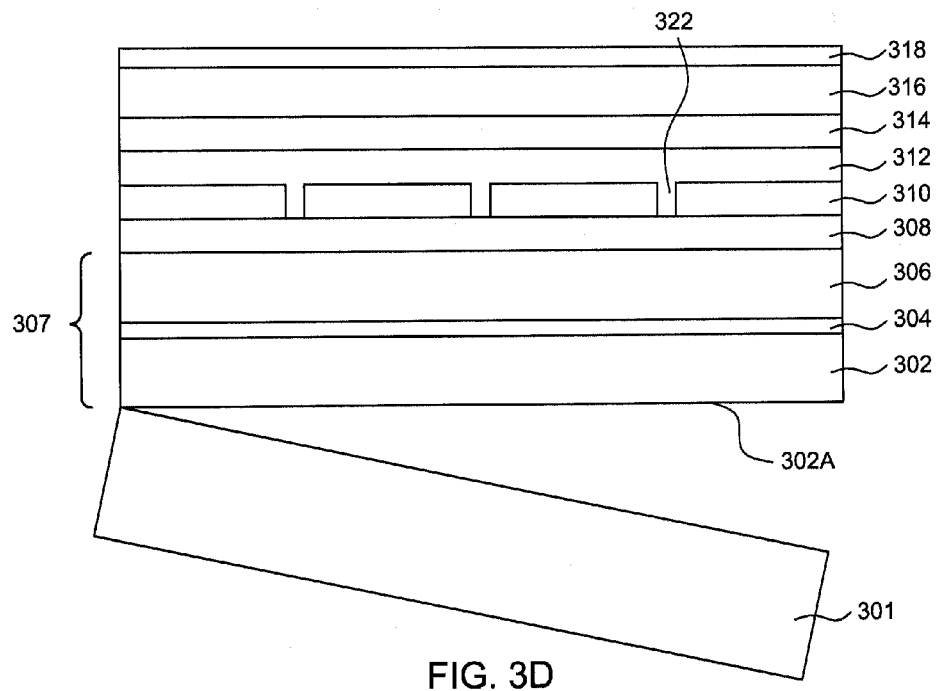

As shown in FIG. 3D, a conducting substrate 316 is bonded to the metal layer 314, and a p-type electrode 318 is then formed on the conducting substrate 316. The metal layer 314 can increase conductivity of the electrode structure and promote bonding or electro-plating of the electrode structure on the conducting substrate 316. Subsequently, the insulating substrate 301 can be removed to expose the surface 302A of the n-type semiconductor layer 302.

Figure 3E:
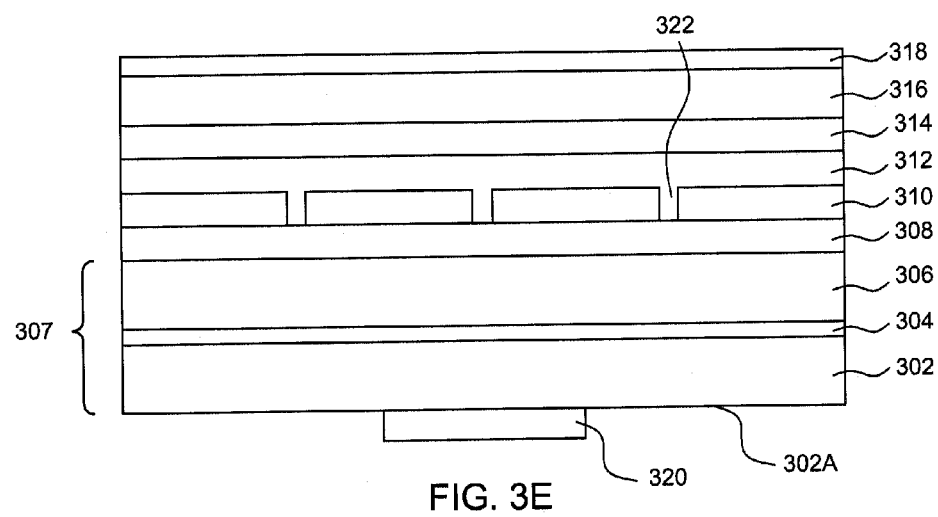

Referring to FIG. 3E, a n-type electrode 320 is formed on the surface 302A of the n-type semiconductor layer 302 to complete the vertical light-emitting diode.

At least one advantage of the above method is the ability to use the combination of the transparent conducting layer 308 and the transparent dielectric layer 310 as structural layers for improving light extraction. As these layers are formed after completion of the epitaxy growth (i.e., comprising the n-type semiconductor layer 302, the emitting layer 304 and the p-type semiconductor layer 306), the deposition of the group III-nitride semiconductor compounds is not affected.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims and its equivalent systems and methods.

What is claimed is:

1. A vertical light-emitting diode comprising:
a multi-layer structure comprising a plurality of group III-nitride semiconductor compound layers, wherein the multi-layer structure has a first outer surface and a second outer surface opposite to the first outer surface;
a transparent conducting layer located on the first outer surface, the transparent conducting layer substantially covering the first outer surface;
a transparent dielectric layer in contact with the transparent conducting layer on a side opposite to the side of the multi-layer structure, wherein the transparent dielectric layer includes a plurality of contact windows;
a first electrode structure located on the transparent dielectric layer and in contact with the transparent conducting layer via the contact windows; and
a second electrode structure located on the second outer surface.

2. The vertical light-emitting diode of claim 1, wherein the first electrode structure comprises a reflective layer that substantially fills the contact windows, the reflective layer contacting with the transparent conducting layer through the contact windows.

3. The vertical light-emitting diode of claim 1, wherein the first electrode structure comprises a conducting substrate.

4. The vertical light-emitting diode of claim 3, wherein the conducting substrate is a metallic or semiconductor substrate.

5. The vertical light-emitting diode of claim 1, wherein the transparent dielectric layer contains $SiO_2$, $Si_3N_4$, or $TiO_2$.

6. The vertical light-emitting diode of claim 1, wherein the transparent dielectric layer has a thickness smaller than about 2 microns.

7. The vertical light-emitting diode of claim 1, wherein the transparent conducting layer has a thickness smaller than about 4000 Angstroms.

8. The vertical light-emitting diode of claim 1, wherein the multi-layer structure comprises a multiple quantum well structure.

9. The vertical light-emitting diode of claim 1, wherein the transparent conducting layer is made of a transparent conducting oxide material including indium tin oxide or aluminum zinc oxide.

10. A vertical light-emitting diode comprising:
a multi-layer structure comprising a plurality of group III-nitride semiconductor compound layers, wherein the multi-layer structure has a first outer surface and a second outer surface opposite to the first outer surface;
a transparent conducting layer in contact with the first outer surface;
a transparent dielectric layer in contact with the transparent conducting layer on a side opposite to the side of the multi-layer structure, the transparent dielectric layer being spaced apart from the first outer surface of the multi-layer structure and including a plurality of contact windows;
a first electrode structure located on the transparent dielectric layer and in contact with the transparent conducting layer through the contact windows; and
a second electrode structure located on the second outer surface.

11. The vertical light-emitting diode of claim 10, wherein the first electrode structure comprises a reflective layer that fills the contact windows, the reflective layer contacting with the transparent conducting layer through the contact windows.

12. The vertical light-emitting diode of claim 10, wherein the first electrode structure comprises a conducting substrate made of a metallic or semiconductor material.

13. The vertical light-emitting diode of claim 10, wherein the transparent dielectric layer contains $SiO_2$, $Si_3N_4$, or $TiO_2$.

14. The vertical light-emitting diode of claim 10, wherein the transparent dielectric layer has a thickness smaller than about 2 microns.

15. The vertical light-emitting diode of claim 10, wherein the transparent conducting layer entirely covers the first outer surface and has a thickness smaller than about 4000 Angstroms.

16. The vertical light-emitting diode of claim 10, wherein the multi-layer structure comprises a multiple quantum well structure.

17. The vertical light-emitting diode of claim 10, wherein the transparent conducting layer is made of a transparent conducting oxide including indium tin oxide or aluminum zinc oxide.

18. A vertical light-emitting diode comprising: a multi-layer structure comprising a plurality of group III-nitride semiconductor compound layers, wherein the multi-layer structure has a first outer surface and a second outer surface opposite to the first outer surface; a transparent conducting layer in contact with the first outer surface, the transparent conducting layer substantially covering the first outer surface; the transparent conducting layer being made of a transparent conducting oxide material; a transparent dielectric layer in contact with the transparent conducting layer on a side opposite to the side of the multi-layer structure, the transparent dielectric layer including a plurality of contact windows; a first electrode structure located on the transparent dielectric layer and in contact with the transparent conducting layer through the contact windows; and a second electrode structure located on the second outer surface.

19. The vertical light-emitting diode of claim 18, wherein the first electrode structure comprises a reflective layer that substantially fills the contact windows, the reflective layer contacting with the transparent conducting layer through the contact windows.

20. The vertical light-emitting diode of claim 19, wherein the reflective layer substantially cover the transparent dielectric layer at a side opposite to that of the transparent conducting layer.

* * * * *